United States Patent
Pachamuthu et al.

(10) Patent No.: US 9,830,998 B2
(45) Date of Patent: Nov. 28, 2017

(54) STRESS PATTERNS TO DETECT SHORTS IN THREE DIMENSIONAL NON-VOLATILE MEMORY

(71) Applicant: SANDISK TECHNOLOGIES INC., Plano, TX (US)

(72) Inventors: Jayavel Pachamuthu, San Jose, CA (US); Sagar Magia, Milpitas, CA (US); Ankitkumar Babariya, Milpitas, CA (US); Jagdish Sabde, Fremont, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/716,794

(22) Filed: May 19, 2015

(65) Prior Publication Data

US 2016/0343454 A1 Nov. 24, 2016

(51) Int. Cl.
| | |
|---|---|
| *G11C 29/10* | (2006.01) |
| *G11C 29/06* | (2006.01) |
| *G11C 29/02* | (2006.01) |
| *G11C 5/02* | (2006.01) |
| *G11C 16/34* | (2006.01) |
| *G11C 29/50* | (2006.01) |

(Continued)

(52) U.S. Cl.
CPC ............ *G11C 29/025* (2013.01); *G11C 5/025* (2013.01); *G11C 16/349* (2013.01); *G11C 16/3495* (2013.01); *G11C 29/06* (2013.01); *G11C 29/10* (2013.01); *G11C 29/50008* (2013.01); *G11C 16/0483* (2013.01); *H01L 27/11582* (2013.01)

(58) Field of Classification Search
CPC ..... G11C 29/50; G11C 16/0483; G11C 16/14; G11C 16/26; G11C 2029/5004
See application file for complete search history.

(56) References Cited

U.S. PATENT DOCUMENTS

| | | |
|---|---|---|
| 4,999,813 A | 3/1991 | Ohtsuka |
| 5,400,343 A | 3/1995 | Crittenden |

(Continued)

FOREIGN PATENT DOCUMENTS

| | | |
|---|---|---|
| EP | 1531493 | 5/2005 |
| EP | 1453062 | 6/2006 |

*Primary Examiner* — Huan Hoang
*Assistant Examiner* — Roberto Mancera, Jr.
(74) *Attorney, Agent, or Firm* — Vierra Magen Marcus LLP

(57) ABSTRACT

A non-volatile storage system includes a three dimensional structure comprising vertical columns of memory cells and a managing circuit in communication with the vertical columns. The managing circuit applies one or more patterns of stress voltages to the vertical columns, with different voltages applied to each vertical column of pairs of adjacent vertical columns being tested for shorts. The managing circuit tests for a short in the pairs of adjacent vertical columns after applying the one or more patterns of stress voltages. In one embodiment, the test may comprise programming a memory cell in each vertical column with data that matches the pattern of stress voltages, reading from the memory cells and determining whether data read matches data programmed. The applying of the stress voltages and the testing can be performed as part of a test during manufacturing or in the field during user operation.

13 Claims, 14 Drawing Sheets

(51) Int. Cl.
*G11C 16/04* (2006.01)
*H01L 27/11582* (2017.01)

(56) References Cited

U.S. PATENT DOCUMENTS

| | | | |
|---|---|---|---|
| 6,304,504 B1 * | 10/2001 | Chevallier | G11C 29/50 |
| | | | 365/185.09 |
| 6,515,923 B1 | 2/2003 | Cleeves | |
| 6,858,450 B1 | 2/2005 | Doan | |
| 6,966,016 B2 | 11/2005 | Naksrikram | |
| 7,050,343 B2 | 5/2006 | Kumar | |
| 7,099,211 B2 | 8/2006 | Jeong | |
| 8,737,149 B2 | 5/2014 | Riho | |
| 9,224,502 B1 * | 12/2015 | Sabde | G11C 16/3459 |
| 9,250,992 B1 * | 2/2016 | Tam | G06F 11/0787 |
| 9,299,438 B2 * | 3/2016 | Hara | G11C 16/0408 |
| 2004/0049724 A1 * | 3/2004 | Bill | G11C 29/48 |
| | | | 714/733 |
| 2011/0286279 A1 * | 11/2011 | Lei | G11C 16/3404 |
| | | | 365/185.19 |
| 2014/0157053 A1 | 6/2014 | Mozak | |

\* cited by examiner

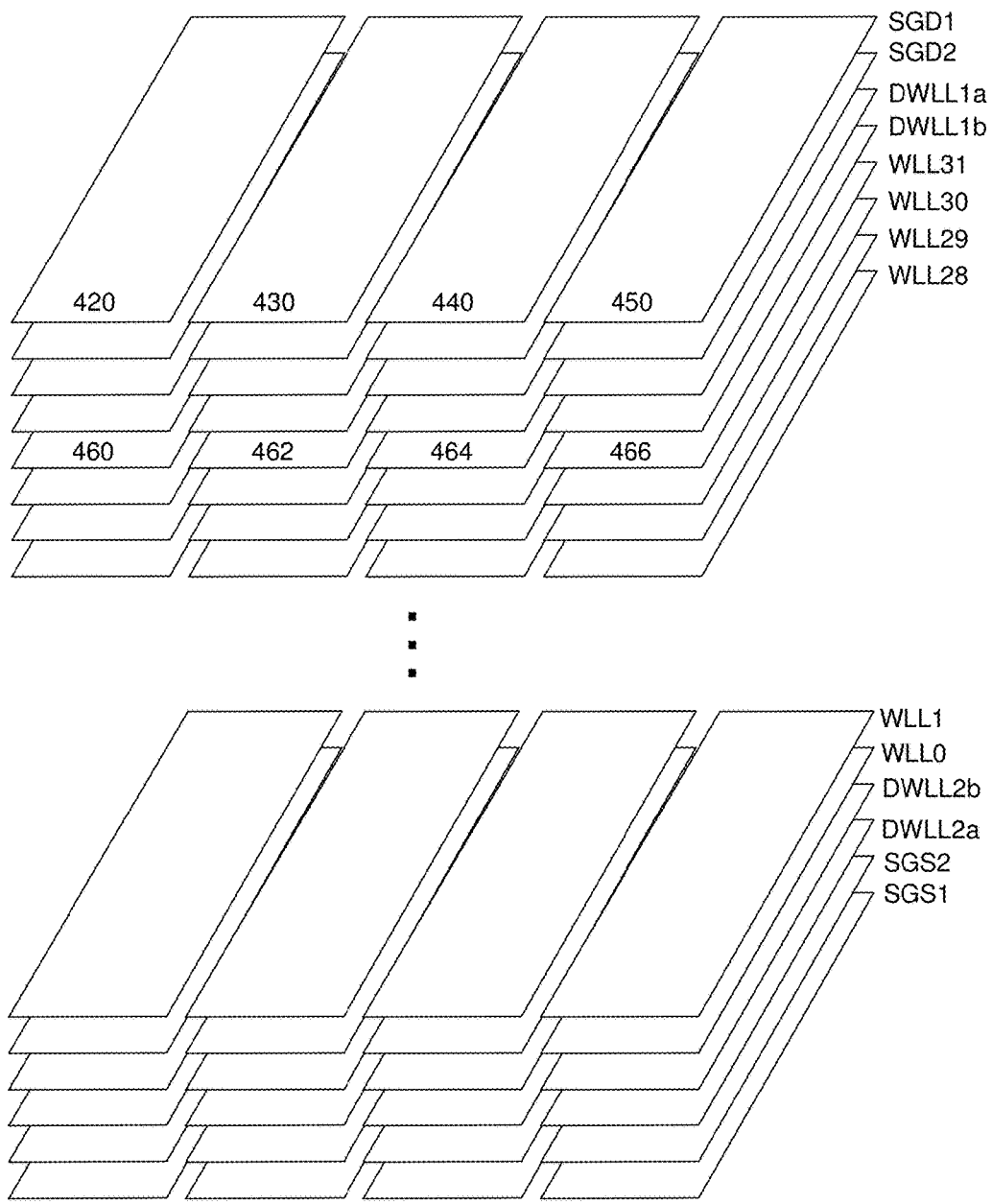

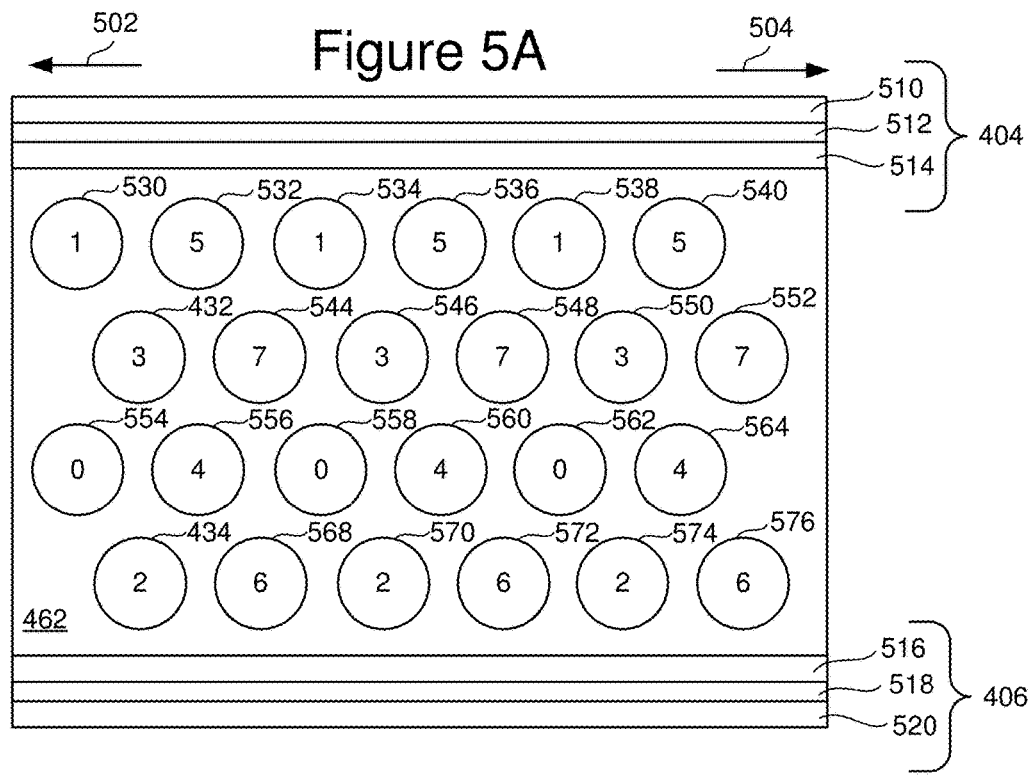
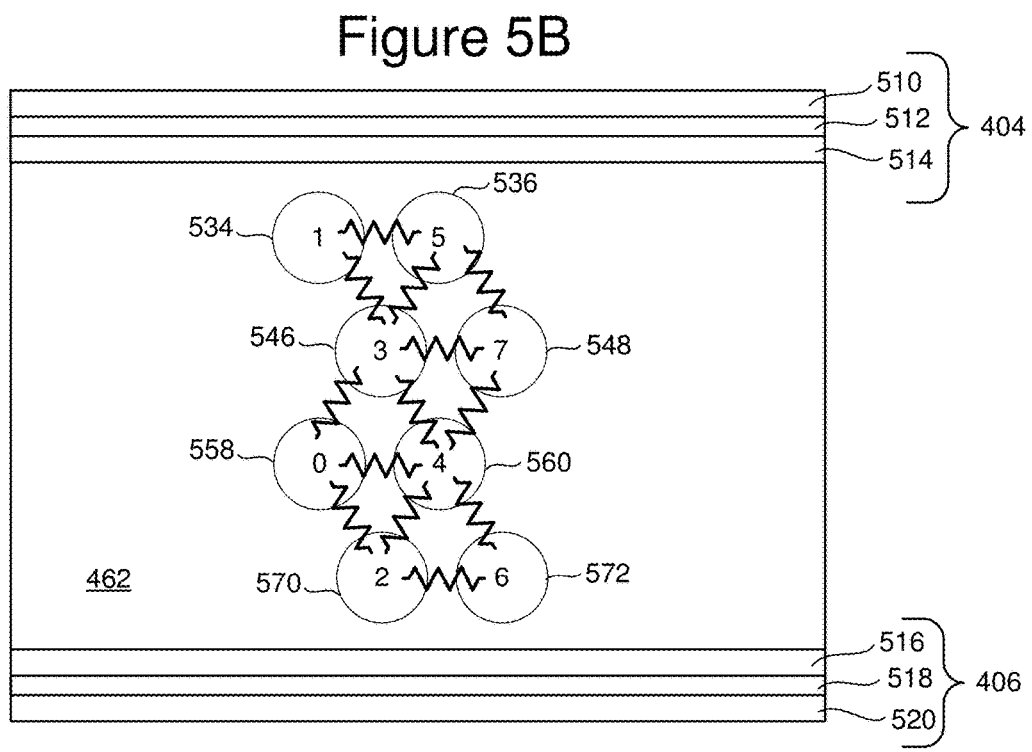

US 9,830,998 B2

STRESS PATTERNS TO DETECT SHORTS IN THREE DIMENSIONAL NON-VOLATILE MEMORY

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer to create a vertical column of memory cells. A straight NAND string extends in one memory hole. Control gates of the memory cells are provided by the conductive layers.

Shrinking the size of the components allows the capacity of the memory system to be increased. However, manufacturing with smaller dimensions can be more difficult, and increases the risk of structural defects.

BRIEF DESCRIPTION OF THE DRAWINGS

Like-numbered elements refer to common components in the different figures.

FIG. 4D depicts a view of the select gate layers and word line layers.

FIG. 5A is a top view of a plurality of vertical columns of memory cells.

FIG. 5B is a top view of a plurality of vertical columns of memory cells, depicting an example set of potential shorts.

DETAILED DESCRIPTION

Many manufacturing processes for semiconductors include performing various tests to identify structural defects. However, sometimes, the structural defects are not severe enough to be discovered by existing tests as these defects do not, at least initially, change device behavior. However, over time and/or after use of the memory system, the defect may become more severe so that it is noticeable and/or it effects the functionality of the device.

One example is when two components are fabricated too close to each other. Initially, the two components operate as intended. However, over time, the two components become shorted together and, eventually, they no longer function correctly.

A process to test for shorts (or other defects) between vertical columns of non-volatile memory cells is proposed that includes applying one or more patterns of stress voltages to the vertical columns Each pattern of stress voltages includes different voltages being applied to each vertical column of pairs of adjacent vertical columns being tested for shorts (or other defects). The pattern(s) of stress voltages serves to accelerate any latent defects so that they can be detected before user data is lost. Therefore, after applying the stress voltages, a test is performed to identify the existence of a short in the pairs of adjacent vertical columns. In one embodiment, the test may comprise programming a memory cell in each vertical column with data that matches one or more of the patterns of stress voltages, reading from the memory cells and determining whether data read matches the data programmed. The applying of the stress voltages and the testing can be performed as part of a test during manufacturing or in the field during user operation (e.g., as part of an erase process every X program-erase cycles).

The following discussion provides details of one example of a suitable structure for a memory devices that can implement the proposed technology.

Figure 1:
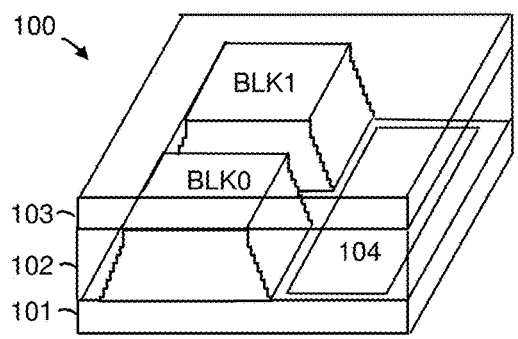
FIG. 1 is a perspective view of a 3D stacked non-volatile memory device.

FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
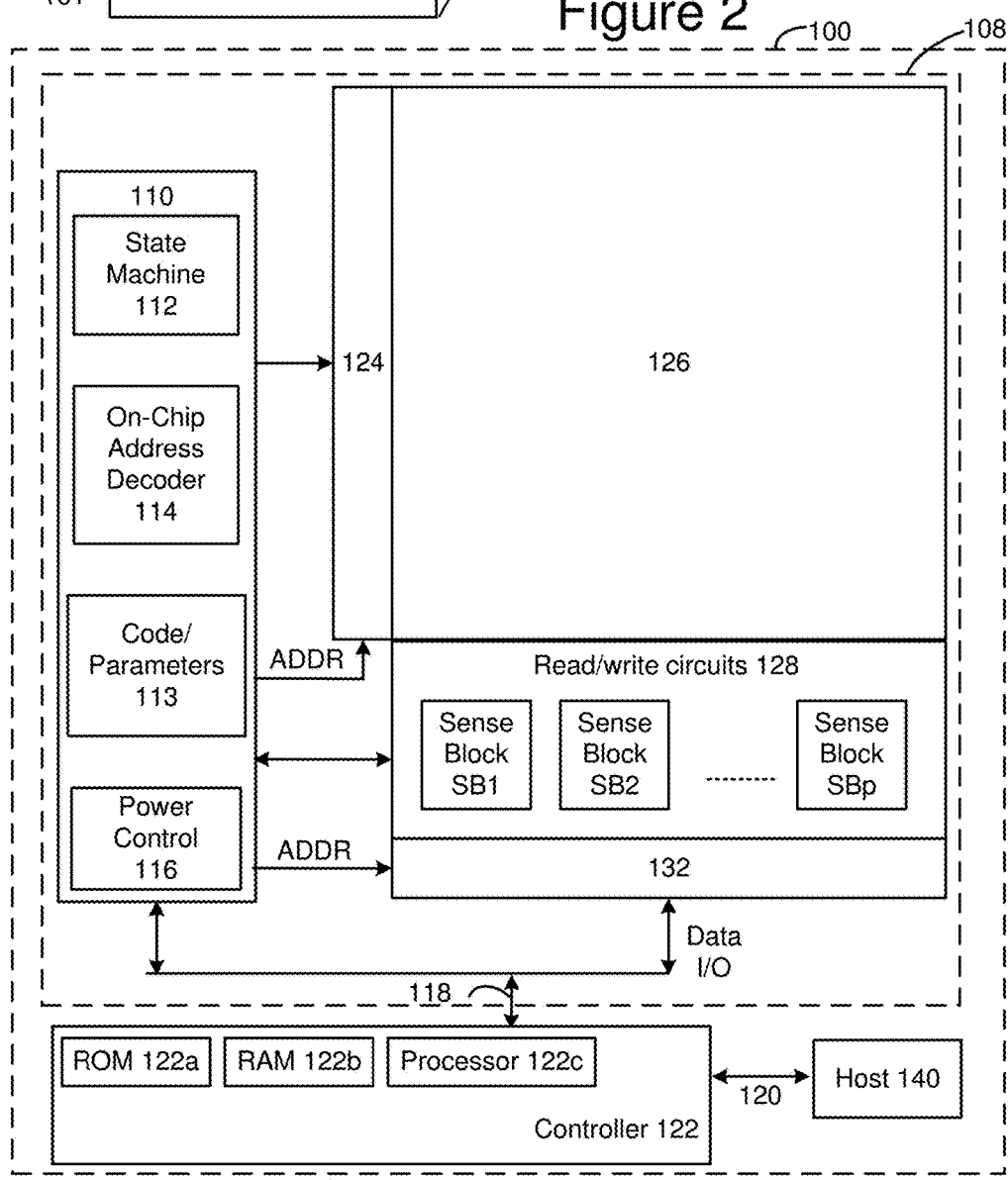
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. Memory device 100 includes one or more memory die 108. Each memory die 108 includes a three dimensional memory structure 126 of memory cells (such as, for example, a 3D array of memory cells), control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electronic circuits).

The on-chip address decoder 114 provides an address interface between addresses used by host 140 or memory controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks SB1, SB2, . . . , SBp, read/write circuits 128, and controller 122 can be considered a managing circuit that performs the functions described herein.

The (on-chip or off-chip) controller 122 may comprise a processor 122c and storage devices (memory) such as ROM 122a and RAM 122b. The storage devices comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that this technology is not limited to a single specific memory structure, but covers many relevant memory structures within the spirit and scope of the technology as described herein and as understood by one of ordinary skill in the art.

Figure 3A:
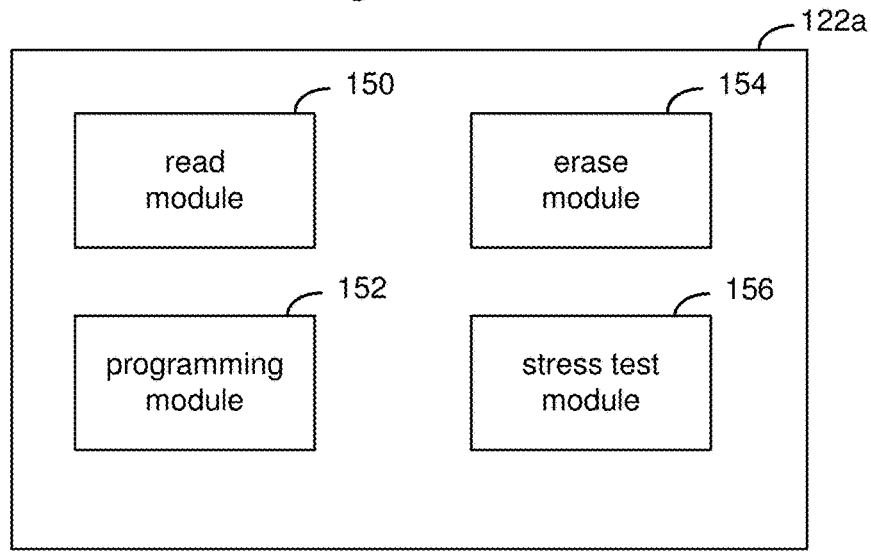
FIG. 3A is a block diagram depicting software modules for programming one or more processors in a Controller.

FIG. 3A is a block diagram depicting software modules for programming one or more processors in controller 122. FIG. 3A depicts read module 150, programming module 152, erase module 154 and stress test module 156 being stored in ROM 122*a*. These software modules can also be stored in RAM or memory die 108. Read module 150 includes software that programs processor(s) 122C to perform read operations. Programming module 152 includes software that programs processor(s) 122C to perform programming operations. Erase module 154 includes software that programs processor(s) 122C to perform erase operations. Stress test module 156 includes software that programs processor(s) 122C to perform stress operations and testing operations, as described herein (see FIGS. 8-10). Based on the software, controller 122 instructs memory die 108 to perform memory operations.

Figure 3B:
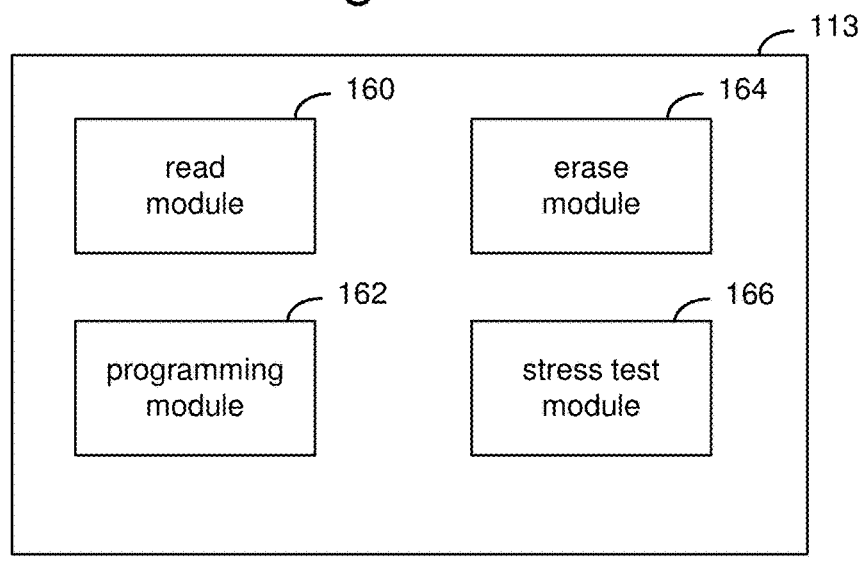
FIG. 3B is a block diagram depicting software modules for programming a state machine or other processor on a memory die.

FIG. 3B is a block diagram depicting software modules for programming state machine 112 (or other processor on memory die 108). FIG. 3B depicts read module 160, programming module 162, erase module 164 and stress test module 166 being stored in code and parameter storage 113. These software modules can also be stored in RAM or in memory structure 126. Read module 160 includes software that programs state machine 112 to perform read operations. Programming module 152 includes software that programs state machine 112 to perform programming operations. Erase module 154 includes software that programs state machine 112 to perform erase operations. Stress test module 156 includes software that programs state machine 112 to perform stress operations and testing operations, as described herein (see FIGS. 8-10). Alternatively, state machine 112 (which is an electronic circuit) can be hard wired so that no software is needed.

Figure 4A:
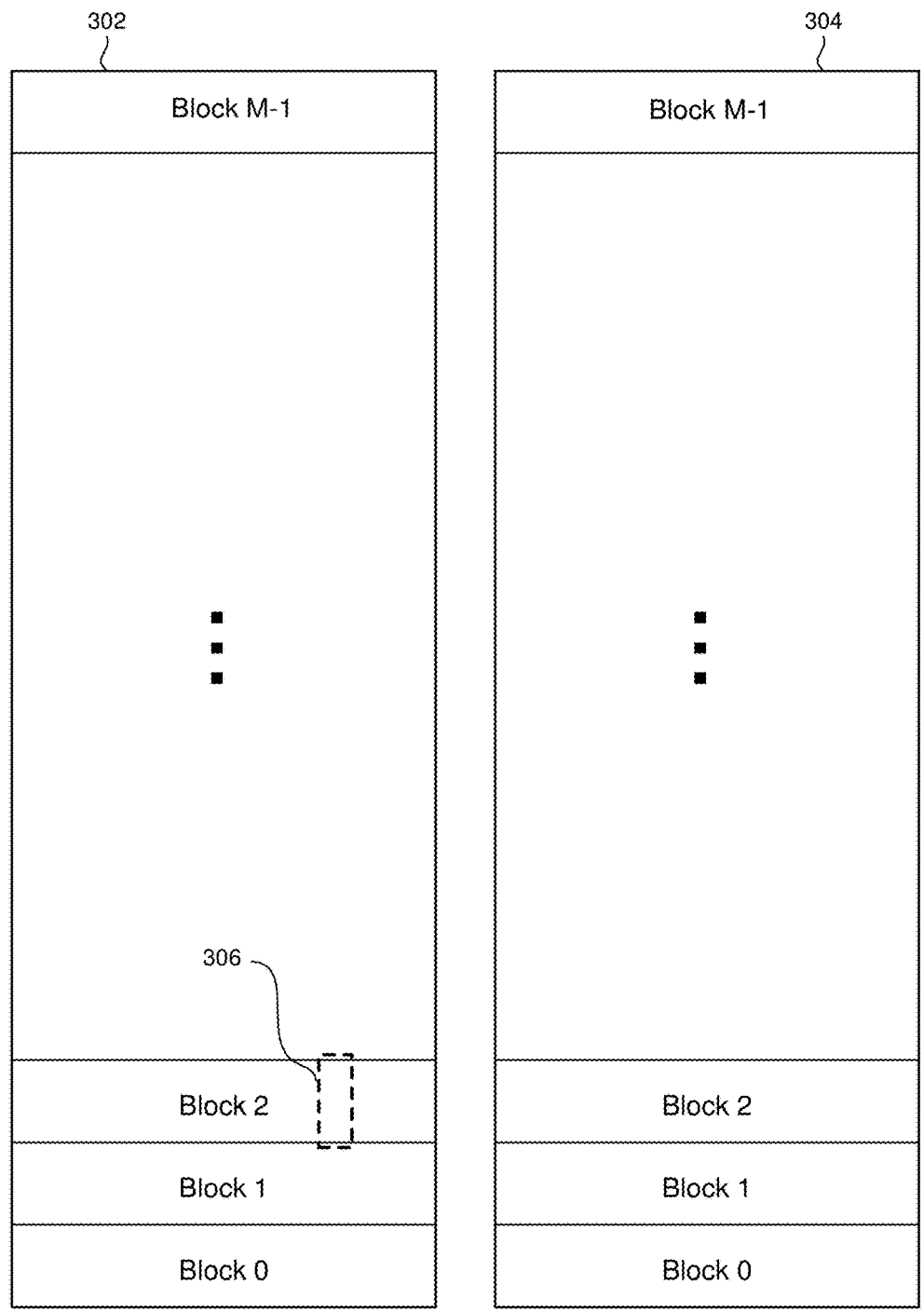
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used.

Figure 4B:
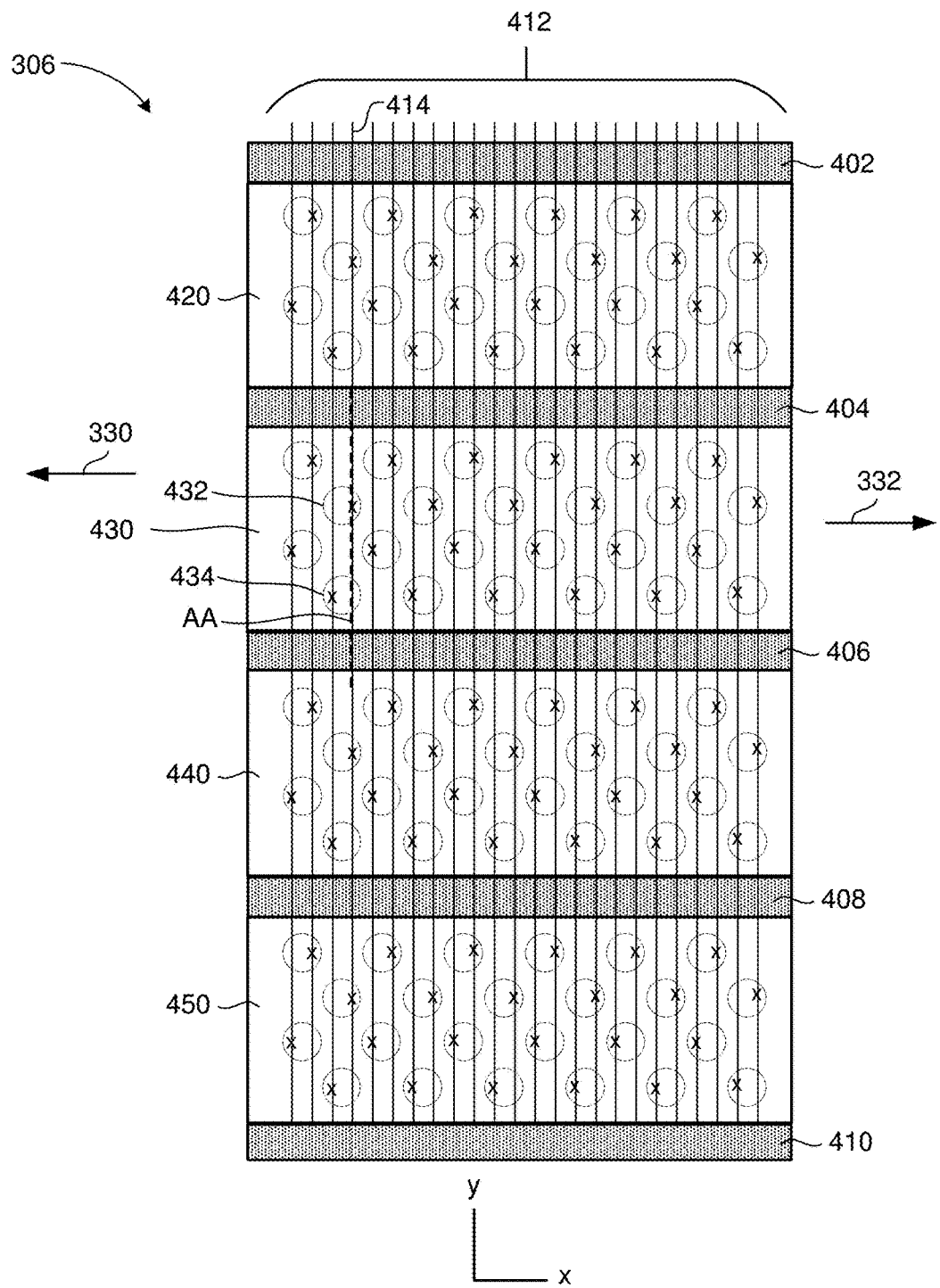
FIG. 4B depicts a top view of a portion of a block of memory cells.

FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of arrow 330 and in the direction of arrow 332. In one embodiment, the memory array will have 48 layers. Other embodiments have less than or more than 48 layers. However, FIG. 4B only shows the top layer.

FIG. 4B depicts a plurality of circles that represent the vertical columns Each of the vertical columns include multiple select transistors and multiple memory cells. In one embodiment, each vertical column implements a NAND string. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 412. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line.

The block depicted in FIG. 4B includes a set of local interconnects 402, 404, 406, 408 and 410 that connect the various layers to a source line below the vertical columns Local interconnects 402, 404, 406, 408 and 410 also serve to divide each layer of the block into four regions; for example, the top layer depicted in FIG. 4B is divided into regions 420, 430, 440 and 450. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
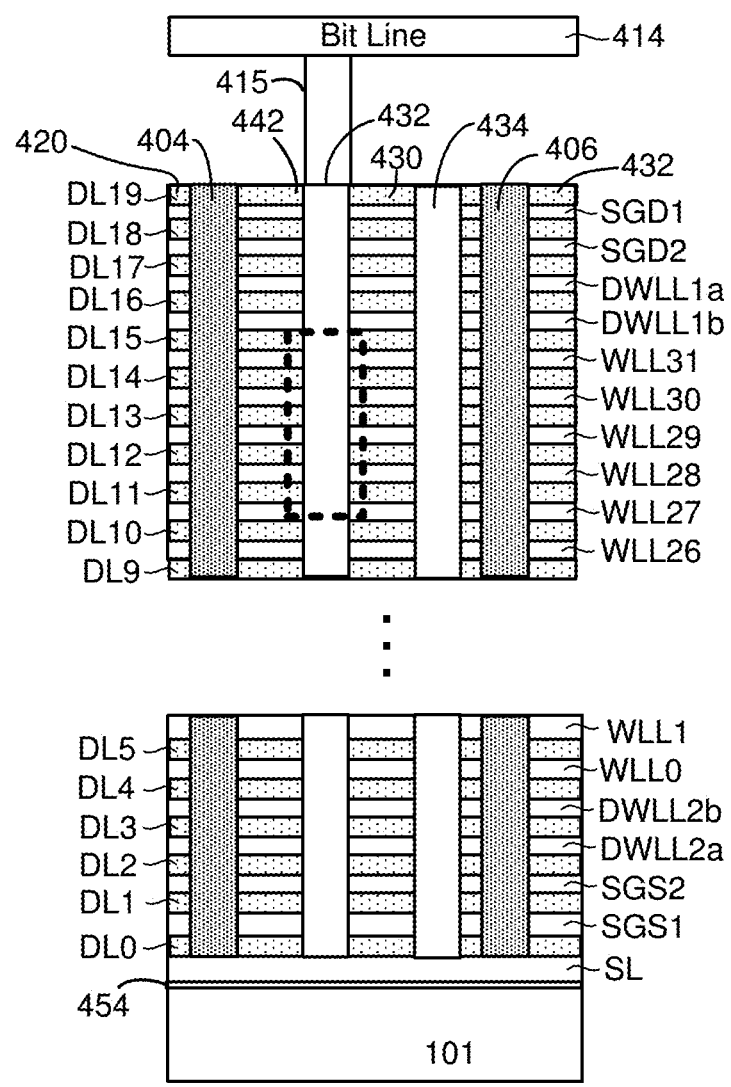
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes two drain side select layers SGD1 and SGD1; two source side select layers SGS1 and SGS2; four dummy word line layers DWLL1*a*, DWLL1*b*, DWLL2*a* and DWLL2*b*; and thirty two word line layers WLL0-WLL31 for connecting to data memory cells. Oher embodiments can implement more or less than two drain side select layers, more or less than two source side select layers, more or less than four dummy word line layers, and more or less than thirty two word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD1 and SGD1; source side select layers SGS1 and SGS2; dummy word line layers DWLL1a, DWLL1b, DWLL2a and DWLL2b; and word line layers WLL0-WLL31 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL19. For example, dielectric layers DL10 is above word line layer WLL26 and below word line layer WLL27. In one embodiment, the dielectric layers are made from $SiO_2$. In other embodiments, other dielectric materials can be used to form the dielectric layers.

The memory cells are formed along vertical columns which extend through alternating conductive and dielectric layers in the stack. In one embodiment, the memory cells are arranged in NAND strings. The word line layer WLL0-WLL31 connect to memory cells (also called data memory cells). Dummy word line layers DWLL1a, DWLL1b, DWLL2a and DWLL2b connect to dummy memory cells. A dummy memory cell, also referred to as a non-data memory cell, does not store user data, while a data memory cell is eligible to store user data. Thus, data memory cells may be programmed. Drain side select layers SGD1 and SGD1 are used to electrically connect and disconnect NAND strings from bit lines. Source side select layers SGS1 and SGS2 are used to electrically connect and disconnect NAND strings from the source line SL.

FIG. 4D depicts a perspective view of the conductive layers (SGD1, SGD1, SGS1, SGS2; DWLL1a, DWLL1b, DWLL2a, DWLL2b, and WLL0-WLL31) for the block that is partially depicted in FIG. 4C. As mentioned above with respect to FIG. 4B, local interconnects 401, 404, 406, 408 and 410 break up each conductive layers into four regions. For example, drain side select gate layer SGD1 (the top layer) is divided into regions 420, 430, 440 and 450. Similarly, word line layer WLL31 is divided into regions 460, 462, 464 and 466. For word line layers (WLL0-WLL31), the regions are referred to as word line fingers; for example, word line layer WLL31 is divided into word line fingers 460, 462, 464 and 466.

Figure 4E:
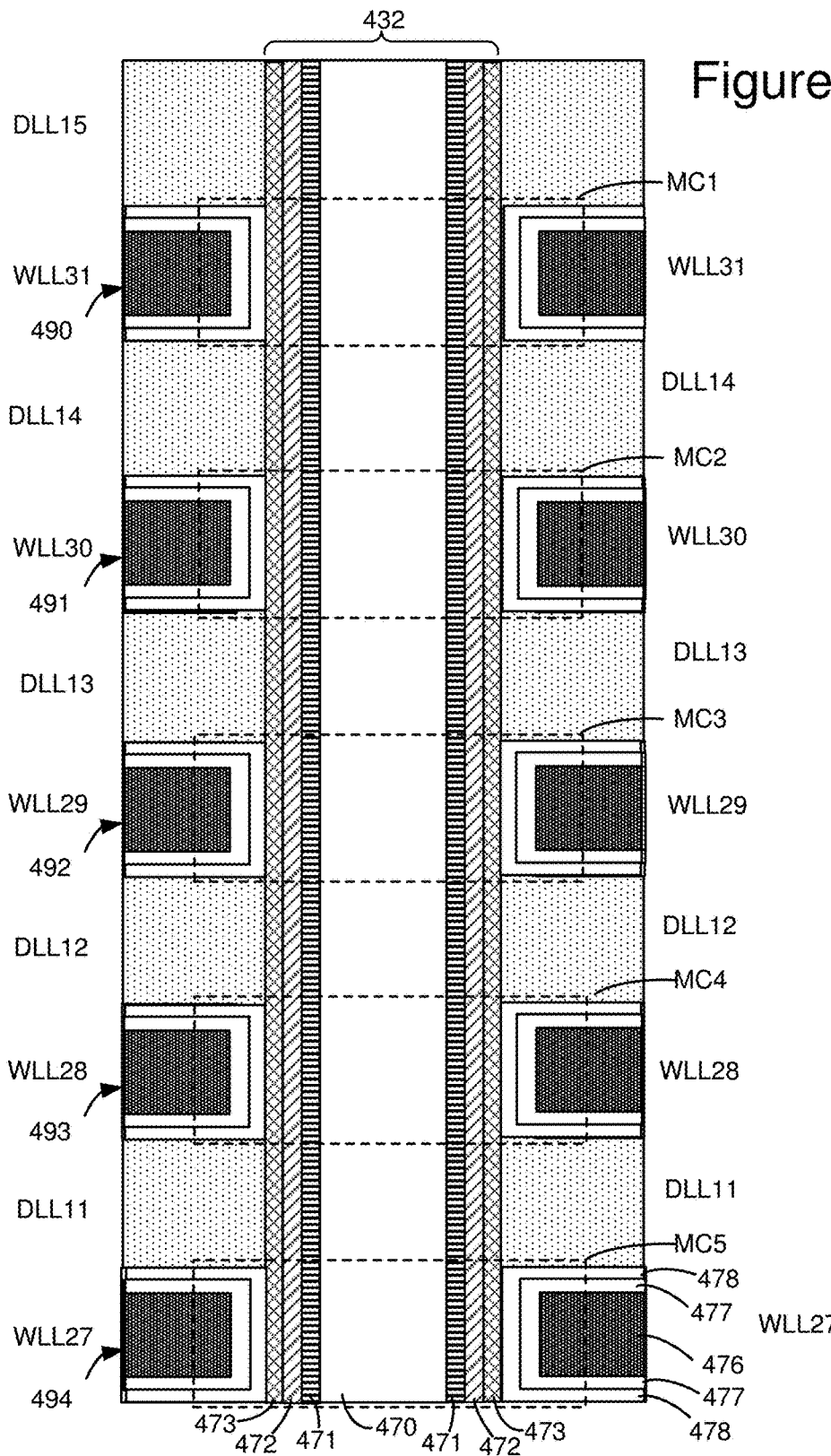
FIG. 4E is a cross sectional view of a vertical column of memory cells.

FIG. 4E depicts a cross sectional view of region 442 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) a specially formulated silicon nitride that increases trap density.

FIG. 4E depicts dielectric layers DLL11, DLL12, DLL13, DLL14 and DLL15, as well as word line layers WLL27, WLL28, WLL29, WLL30, and WLL31. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL31 and a portion of vertical column 432 comprise a memory cell MC1. Word line layer WLL30 and a portion of vertical column 432 comprise a memory cell MC2. Word line layer WLL29 and a portion of vertical column 432 comprise a memory cell MC3. Word line layer WLL28 and a portion of vertical column 432 comprise a memory cell MC4. Word line layer WLL27 and a portion of vertical column 432 comprise a memory cell MC5.

When a memory cell is programmed, electrons are stored in a portion of the charge trapping layer 473 which is associated with the memory cell. These electrons are drawn into the charge trapping layer 473 from the channel 471, through the tunneling layer 473, in response to an appropriate voltage on word line region 476. The threshold voltage (Vth) of a memory cell is increased in proportion to the amount of stored charge. During an erase operation, the electrons return to the channel or holes recombine with electrons.

FIG. 5A shows a cross sectional top view of a portion of word line finger 462 (see FIG. 4D), which is part of word line layer WLL31. Note that word line finger 462 also extends in the directions indicated by arrows 502 and 504. On one side of word line finger 462 is local interconnect 404 and on the other side of word line finger 462 is local interconnect 406. FIG. 5A provides more details of the local interconnects. Local interconnect 404 includes three layers: 510, 512 and 514. Layer 510 is an oxide layer (e.g., SiO2), layer 512 is made of Tungsten (or other appropriate material) with a conductive barrier metal layer, and layer 514 is an oxide layer (e.g., SiO2). Local interconnect 406 also includes three layers: 516, 518 and 520. Layers 516 and 520 are oxide layers. Layer 518 is made of Tungsten (or other suitable material). In the portion of word line finger 462 included in FIG. 5A, twenty four vertical columns are depicted as circles: 530, 532, 534, 536, 538, 540, 432, 544, 546, 548, 550, 552, 554, 556, 558, 560, 562, 564, 434, 568, 570, 572, 574 and 576. As FIG. 5A only shows a portion of word line finger 462, only a subset of vertical columns are depicted, and there are additional vertical columns in directions 502 and 504. Each of the vertical columns includes multiple memory cells.

In one embodiment, memory die 108 includes a set of eight I/O pins that connect to lines 118 for communication to controller 122 (see FIG. 2). Within each of the circles representing the vertical columns depicted in FIG. 5A is a number. This number identifies one of the eight I/O pins of memory die 108 that is in communication with the depicted vertical column via a bit line (see FIG. 4B). In one embodiment, the pattern of connections to I/O pins is repeated across the vertical columns of the word line finger.

Many manufacturing processes for semi-conductors (such as memory dies) include performing various tests to identify structural defects. However, sometimes, the structural defects are not severe enough to be discovered by existing tests as these defects do not, at least initially, change device behavior. Therefore, the defects will not cause a failure of any tests. However, over time and/or after use of the memory system, the defect may become more severe so that it is noticeable and/or it affects the functionality of the device.

One example is when two of the vertical columns are fabricated too close to each other such that there becomes a short between the vertical columns. Alternatively, if one or more vertical columns are made too big or in an odd shape, that vertical column can touch, or become too close to, an adjacent vertical column and cause a short between the two vertical columns. In some instances, the defect in positioning, size or shape does not cause a short right away. Initially, the two vertical columns will operate as intended. However, over time, the two vertical columns and memory cells become shorted together and, eventually, they no longer function correctly.

FIG. 5B shows the same portion of word line finger 462 as FIG. 5A. However, only eight of the vertical columns are depicted: 534, 536, 546, 548, 558, 560, 570 and 572. A set of resistor symbols are drawn in FIG. 5B to illustrate a set of possible defects (e.g., shorts). These defects can be responsible for bit line leaks, vertical column open failures, as well as other problems that cause yield and reliability issues.

Figure 6A:
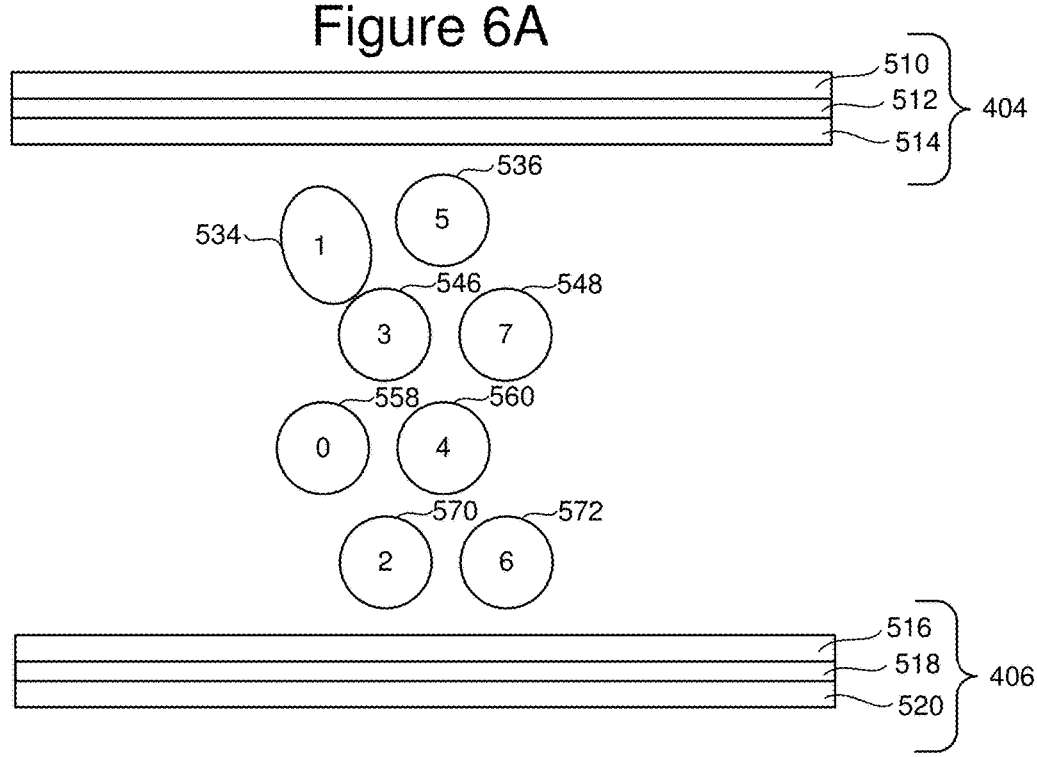
FIG. 6A is a top view of a plurality of vertical columns of memory cells, depicting an example short.
Figure 6B:
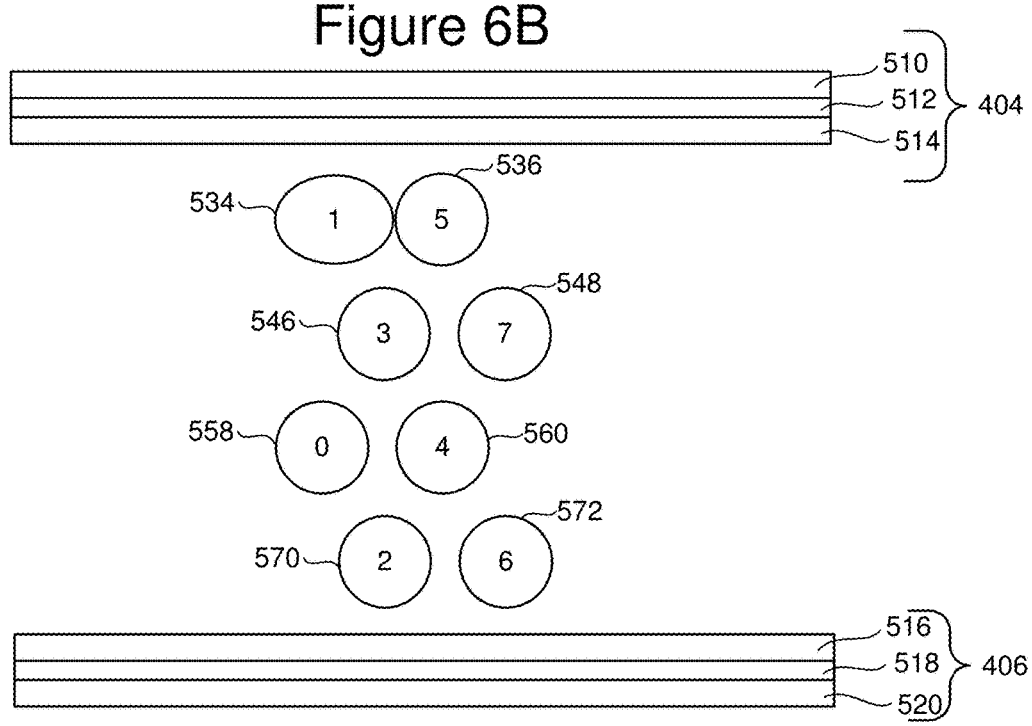
FIG. 6B is a top view of a plurality of vertical columns of memory cells, depicting an example short.
Figure 6C:
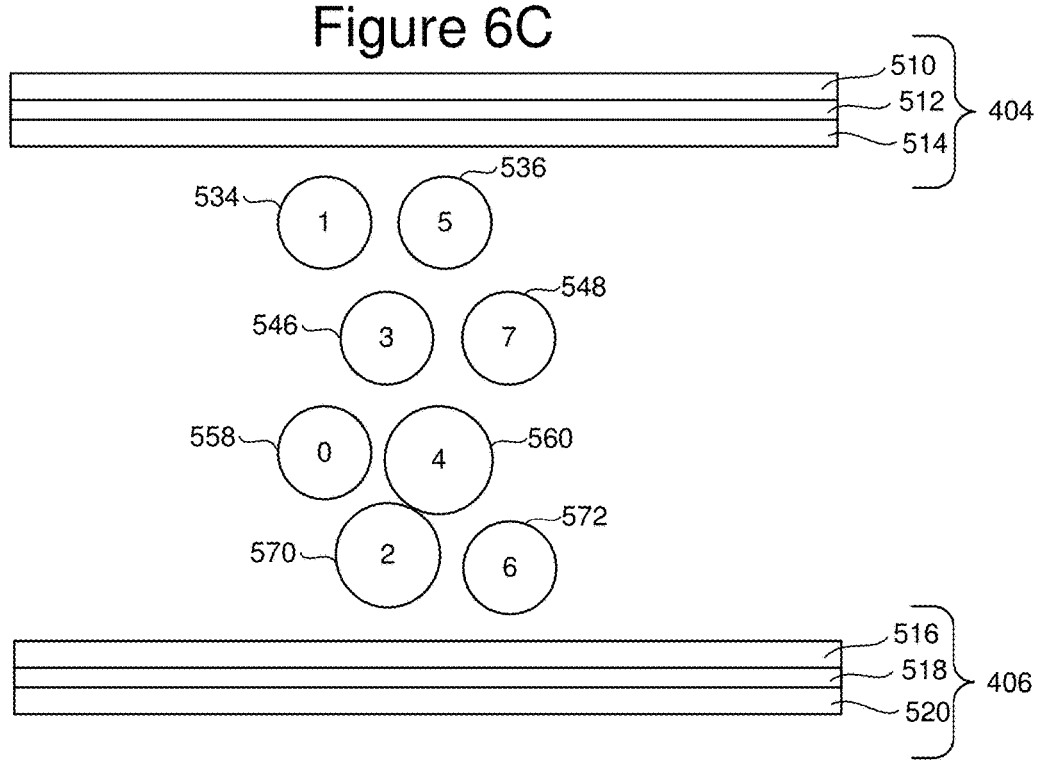
FIG. 6C is a top view of a plurality of vertical columns of memory cells, depicting an example short.
Figure 6D:
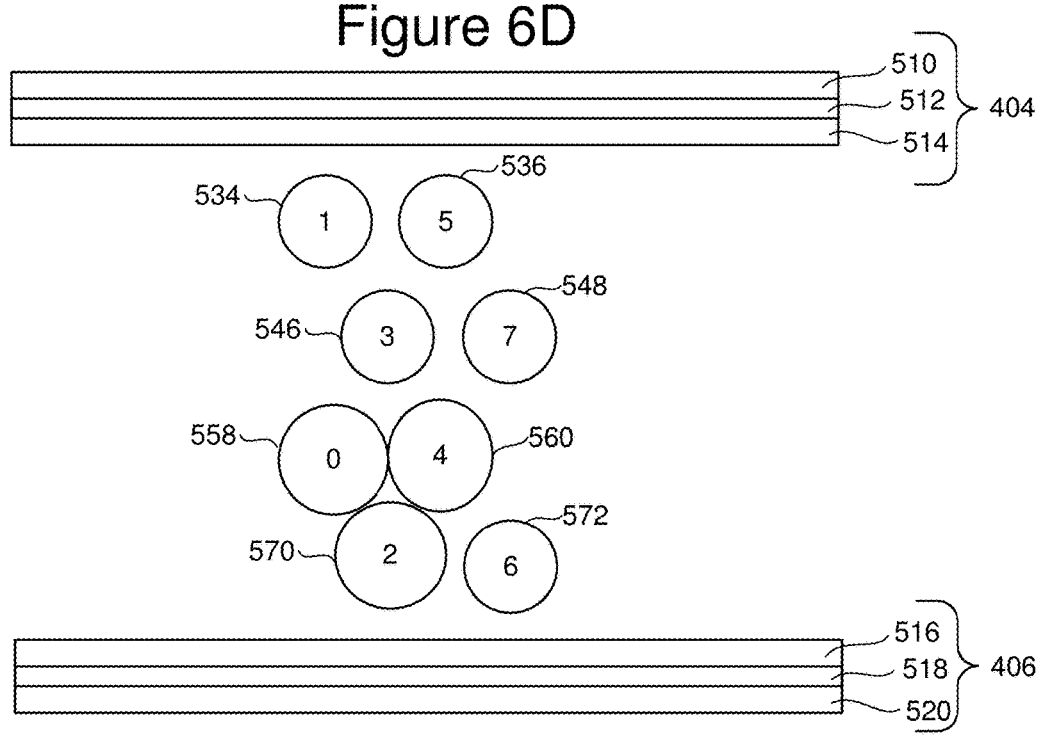
FIG. 6D is a top view of a plurality of vertical columns of memory cells, depicting an example 3-way short.

FIGS. 6A-6D show the same portion of word line finger 462 as in FIG. 5B, depicting examples of structural defects with respect to the size, shape or positioning of the vertical columns. For example, FIG. 6A shows that vertical column 534 is manufactured with a defect in its shape and position so that it touches or becomes too close to vertical column 546. FIG. 6B shows vertical column 534 having a defect in its shape so that it becomes too close to or touching vertical column 536. FIG. 6C shows defects in the size of vertical columns 560 and 570 so that those two vertical columns become too close together and cause a possible defect. FIG. 6D shows a defect in size and location of vertical columns 558, 560 and 570, causing a three-way defect which may potentially lead to a three-way short between the three vertical columns 558, 560 and 570.

To overcome the problems discussed above, a process to test for shorts and/or defects between vertical columns of memory cells is proposed that includes applying one or more patterns of stress voltages to vertical columns of memory cells, with different voltages applied to each vertical column of pairs of adjacent vertical columns being tested for shorts (or other defects). These patterns of stress voltages serve to accelerate any latent defects so that they can be detected before user data is lost. Therefore, after applying the stress voltages, a test is performed to identify the existence of a short in the pairs of adjacent vertical columns. In one embodiment, the test may comprise programming a memory cell in each vertical column with data that matches one or more of the patterns of stress voltages, reading from the memory cells and then determining what the data read matches the data programmed.

Figure 7A:
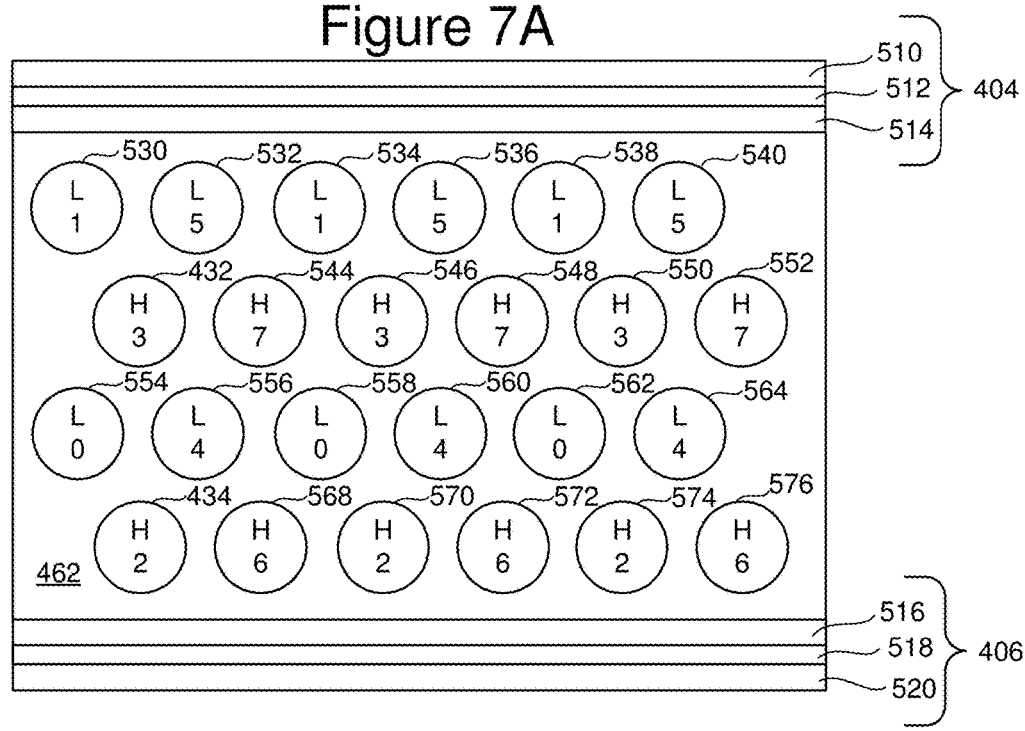
FIG. 7A is a top view of a plurality of vertical columns of memory cells, depicting an example stress pattern.
Figure 7B:
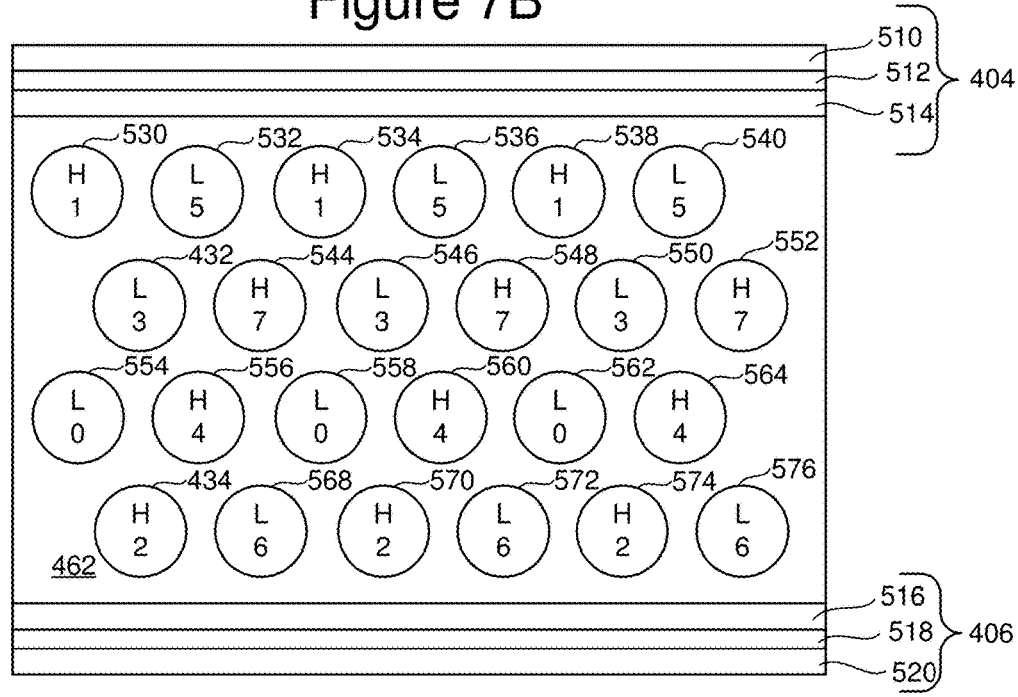
FIG. 7B is a top view of a plurality of vertical columns of memory cells, depicting an example stress pattern.

FIGS. 7A and 7B provide examples of two patterns of stress voltages. In other embodiments, more than two patterns of stress voltages can be used. In some embodiments, only one pattern of stress voltages needs to be used.

FIG. 7A shows the same portion of word line finger 462 as depicted in FIG. 5A. Inside each of the circles representing the vertical columns 432, 434 and 530-576 are the numbers indicating the corresponding I/O pins discussed above. In addition, each circle also includes a "L" or "H" that represents the stress voltage being applied to that vertical column. The "L" corresponds to a low voltage (e.g., approx. zero volts) being applied to that vertical column (via its bit line) as part of the pattern of stress voltages. The "H" represents a high voltage being applied to that vertical column (via its bit line) as part of the pattern of stress voltages. One example of a high voltage is the internal Vdd (e.g., approx. 2.5 volts) plus an offset (e.g., 0.1 volt), for a total of 2.6 volts. Other high voltages can also be used. The pattern of stress voltages depicted in FIG. 7A tests for shorts between vertical columns in different rows, of the four rows depicted in FIG. 7A. For example, vertical column 530 and vertical column 432 are a pair of adjacent (neighboring) vertical columns being tested for shorts by the pattern of stress voltages depicted in FIG. 7A. Other examples of pairs of adjacent (neighboring) vertical columns being tested for shorts by the pattern of stress voltages of FIG. 7A include 532/432, 532/544, 534/544, 534/546, 536/546, 536/548, etc. Within each pair of adjacent vertical columns being tested for shorts by the pattern of stress voltages of FIG. 7A, the vertical columns receive different voltages. For example, the vertical columns 530 and 432 receive different voltages. That is, vertical column 530 receives a low voltage L (e.g., zero volts) and vertical column 432 receives a high voltage H (e.g., 2.6 volts).

The stress voltages applied to the vertical column are applied as a pattern of stress voltages. In one embodiment, the pattern of stress voltages is 8 signals because there are eight I/O pins for the memory die, and this eight bit pattern of stress voltages is repeated across the vertical columns of word line finger 462. In another embodiment with N I/O pins, the pattern of stress voltages is an arrangement of N signals that is repeated across the plurality of vertical columns of the word line finger. In other embodiments, the number of signals in the pattern of stress voltages can be unrelated to the number of I/O pins. In some implementations, the pattern of stress voltages is not repeated across vertical columns When the pattern of stress voltages is applied to the vertical columns, the voltages have to be applied long enough in order to accelerate the defect. In one example, the stress voltages are applied for 50 msec. This duration of time for applying the stress voltages is significantly longer than the program pulse applied to the vertical columns (which is about 20-50 usec). In other embodiments, the time for applying the stress voltages can be less or more than 50 msec.

FIG. 7B depicts a second pattern of stress voltages applied to the same vertical columns depicted in FIG. 7A. The pattern of stress voltages of FIG. 7B is different than the pattern of stress voltages of FIG. 7A. In FIG. 7B, the voltages alternate H and L along a row; therefore, neighboring vertical columns along a row serve as the pairs of adjacent vertical columns being tested for shorts. For example, vertical columns 530 and 532 are one example of a pair of adjacent vertical columns being tested for shorts by the pattern of stress voltages depicted in FIG. 7B. Other examples of pairs of adjacent vertical columns being tested for shorts include 532/534, 534/536, 536/538, 538/540, 432/544, 544/546, etc. There are also some diagonal pairs (e.g., 534/546) that can also be tested for shorts by the pattern of stress voltages of FIG. 7B. Depending on the geometry of the design, other patterns of stress voltages can also be used. It is contemplated that the application of these one or more patterns of stress voltages will accelerate latent defects. Therefore, after applying the one or more patterns of stress voltages (biasing the vertical columns of non-volatile memory cells with first and second voltage patterns), the system will perform programming and reading in order to test for a defect (e.g., test for a short).

Figure 8:
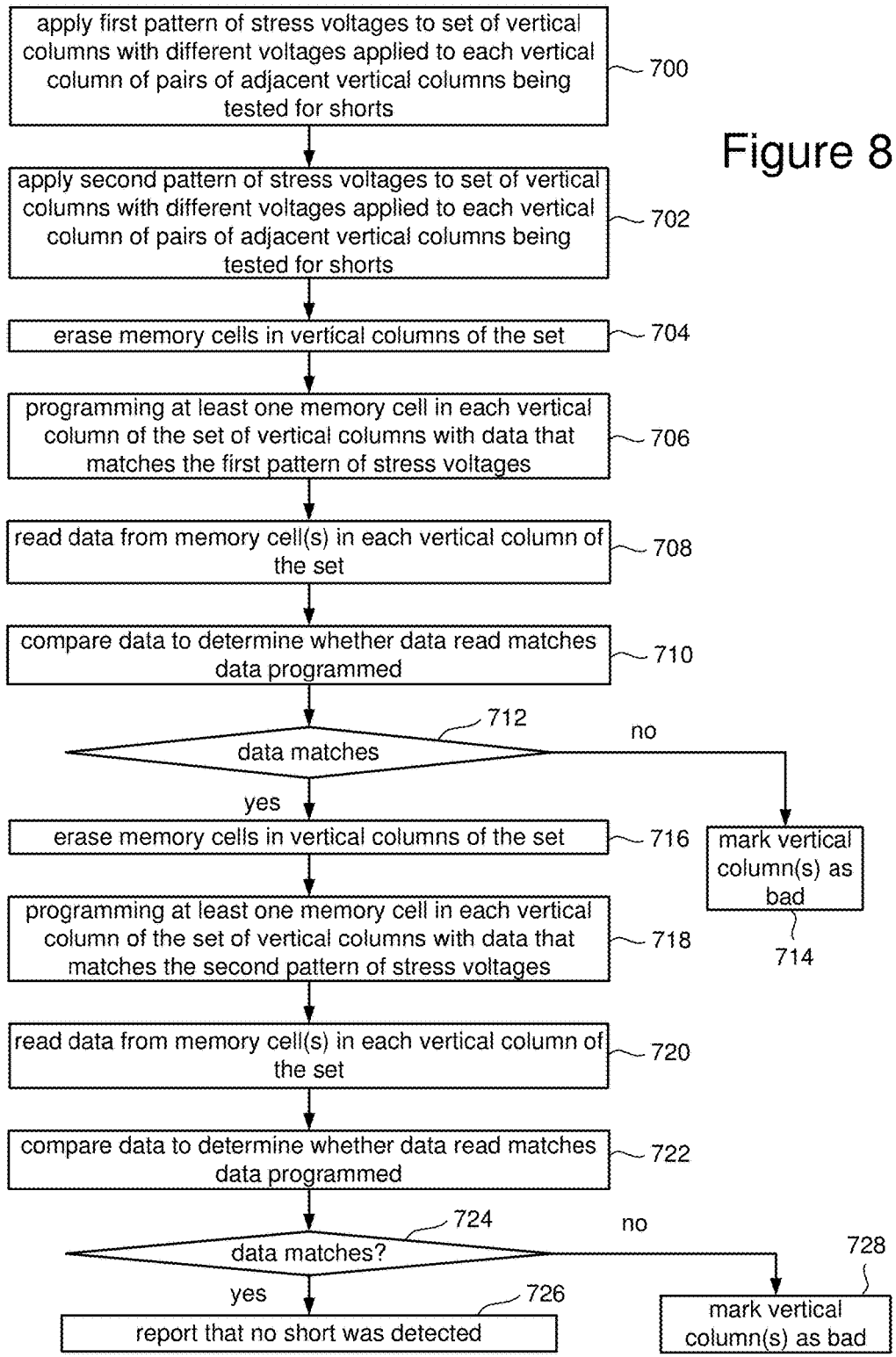
FIG. 8 is a flow chart describing one embodiment of a process for stressing and testing a portion of a three dimensional memory comprising a plurality of vertical columns of memory cells.

FIG. 8 is a flowchart describing one embodiment of a process for stressing and testing a three dimensional memory structure comprising a plurality of vertical columns, with each vertical column including multiple memory cells. That is, the process of FIG. 8 applies one or more patterns of stress voltages (such as, for example, the patterns of stress voltage s of FIGS. 7A and 7B), and then performs a subsequent test to determine whether the stress voltages accelerated any latent defects. In one embodiment, the process of FIG. 8 can be performed entirely by state machine 112. In another embodiment, the process of FIG. 8 can be performed by a combination of controller 122 and state machine 112. For example, controller 122 may send an instruction to state machine 112 to perform the process of FIG. 8. In another example, controller 122 may send separate instructions to state machine 112 to perform each of the steps of FIG. 8 (or a subset of the steps of FIG. 8), and state machine 112 will be responsible for performing each of the steps.

In step 700 of FIG. 8, the system applies the first pattern of stress voltages to a set of vertical columns, with different voltages applied to each vertical column of pairs of adjacent vertical columns being tested for shorts. For example, the vertical pattern of stress voltages depicted in FIG. 7A can be applied to all of the vertical columns of a block (or a subset of those vertical columns) In step 702, after completing the application of the first pattern of stress voltages, the system applies a second pattern of stress voltages to the set of vertical columns with different vertical columns applied to each vertical column or pairs of adjacent vertical columns being tested for shorts. Note that because the first pattern of stress voltages is different than the second pattern of stress voltages, the adjacent pairs of vertical columns being tested for shorts contemplated by step 700 are different than the pairs of adjacent vertical columns being tested for shorts in step 702. For example, looking back at FIGS. 7A and 7b, in step 700, vertical columns 532/432 are a pair of adjacent vertical columns being tested for shorts and in step 702 vertical columns 532/544 are a pair of adjacent vertical columns being tested for shorts.

In step 704, the memory cells in the vertical columns are erased using any suitable erase process known in the art. In step 706, the system will program at least one memory cell in each vertical column of the set of vertical columns. In some embodiments, all of the memory cells in each of the vertical columns are programmed. The vertical columns that receive programming in step 706 are the same vertical columns that receive the stress voltages in steps 700 and 702. In one embodiment, the data programmed into the memory cells of the vertical columns matches the first pattern of stress voltages from step 700. In the example where step 700 applies the pattern of stress voltages of FIG. 7A then a data pattern is programmed in step 706 that also matches the pattern of stress voltages depicted in FIG. 7A. Memory cells and vertical columns that received a "L" voltage in a pattern of stress voltages receive data 0 and memory cells and vertical columns that receive a "H" voltage in the pattern of stress voltages receive a data 1. In other embodiments, other data values (e.g., multi-level data) can also be used as long as different data values are used for L and H. In step 708, data is read from the memory cells that were programmed in step 706. In step 710, the data read in step 708 is compared against the data programmed in step 706. If the data does not match for a vertical column (step 712), that vertical column is marked as a bad vertical column (step 714) and no longer used to store user data. If the data read in step 708 matches the data programmed in step 706 (step 712), then that vertical column is not marked as bad and the process continues at step 716 for vertical columns not marked as bad.

In step 716, the memory cells of the set of vertical columns that received the stress voltages will be erased using any suitable erase process known in the art. In step 718, the system programs at least one memory cell in each vertical column of the set of vertical columns that receive the stress voltages in steps 700 and 702. When programming in step 718, the data programmed into the memory cells will match the pattern of stress voltages applied in step 702. For example, in the embodiment that applies the pattern stress voltages of FIG. 7B, memory cells and vertical columns which received an H stress voltage will receive data 1 and memory cells and vertical columns that received an L stress voltage will receive data 0. Again, other data values can be used to correspond to L and H. The programming process of step 718 (and step 706) can be any standard program process known in the art. In step 720, data is read from the memory cells that were programmed in step 718. The reading process of step 720 (and step 708) can be any suitable reading process known in the art. In step 722, the system compares the data read in step 720 to the data programmed in step 718. If that data matches (step 724), then the system reports that no short was detected for the vertical columns that have no data mismatches. For any vertical column that the data does not match, that vertical column is marked as bad in step 728 and no longer used to store user data.

Note that the process of FIG. 8 contemplates applying two patterns of stress voltages. However, in some embodiments only one pattern of stress voltage will be applied. In other embodiments, more than two patterns of stress voltages can be applied.

As explained above, in one embodiment the process of FIG. 8 is performed wholly or partially by state machine 112. It is contemplated that state machine 112 and the vertical columns (including the memory cells) are on the same memory die. In those embodiments where state machine 112 is configured to apply the one or more patterns of stress voltages to the plurality of vertical columns and tests for shorts, the patterns of stress voltages are determined on the memory die and the application of the one or more patterns of stress voltages to the plurality of vertical columns and the testing for the shorts are performed entirely on the memory die.

The applying of pattern of stress voltages and testing, as described above with respect to FIG. 8, can be performed as part of a testing process during manufacturing of the memory die or during manufacturing of the memory system that includes the memory die. This test would typically happen in a manufacturing facility or testing facility. In another embodiment, the applying of the pattern of stress voltages and testing, as described above with respect to FIG. 8, can be performed in the field, such as during user operation. In one embodiment, the application of stress voltages and testing of FIG. 8 can be performed during user operation as part of an erase process. Rather than be part of the erase process, the application of stress voltages and testing can be performed at the same time as the erase process (e.g., with the erase process), or otherwise in conjunction with the erase process during user operation.

The term "during user operation" refers to the situation where the device is no longer being manufactured and tested. Rather, the device has been used to store user data.

Figure 9:
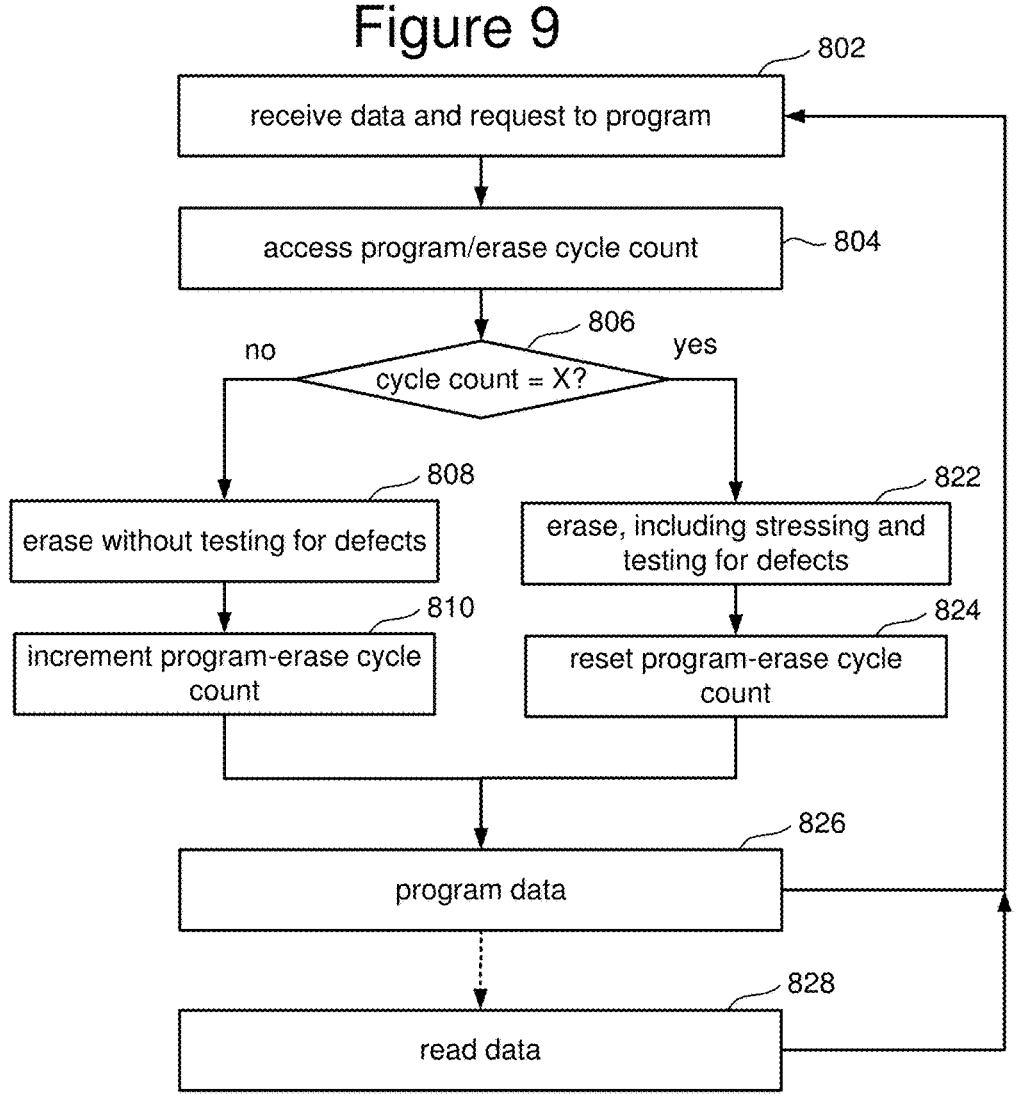
FIG. 9 is a flow chart describing one embodiment of a process for operating non-volatile storage, including determining whether to perform a test process in conjunction with an erase process.

FIG. 9 is a flowchart describing one embodiment of a process for operating nonvolatile storage during user operation, including determining whether to perform a test in conjunction with the erase process. That is, FIG. 9 is a flowchart describing a process for performing a plurality of erase processes and for applying the stress voltages and testing during user operation in conjunction with a subset of erase processes. For example, the system may perform a set of program and erase cycles, where a program and erase cycle includes erasing and programming memory cells. After X program-erase cycles (with X being an integer), the system will apply the one or more patterns of stress voltages and perform the testing as depicted in FIG. 8. In one embodiment, the process of FIG. 9 is performed entirely by state machine 112 (therefore completely performed on the memory die). In another embodiment, the process of FIG. 9 is performed by a combination of controller 122 and state machine 112. For example, controller 122 may instruct state machine 112 to perform all or a subset of the steps depicted in FIG. 9, with state machine 112 performing the actual memory operations. In one embodiment, controller 122 can be the entity/circuit that determines whether the data read matches the data programmed. In other embodiments, state machine 112, or other hardware on the memory die (e.g., sense amplifier or other processing circuitry) can determine whether the data programmed matches the data read (see steps 706, 708, 710, 718, 720 and 722).

In step 802 of FIG. 9, the system receives data and a request to program that data into memory structure 126. In step 804, the system will access a program/erase cycle count. In one embodiment, state machine 112 can maintain a count of how many program and erase cycles have been performed. There can be one count for the entire memory structure 126, one count for each plane, one count for each block, one count for each vertical column, etc. In step 806, it is determined whether the program/erase cycle count equals X. X is a predetermined integer indicating how many program and erase cycles must be performed before the stress and testing of FIG. 8 will be performed. In various example implementations, X could equal 100 cycles, 500 cycles, 1,000 cycles, or 10,000 cycles. If the program/erase cycle count is not equal to X, then it is not time yet to perform the stressing and testing of FIG. 8. Therefore in step 808, an erase process will be performed without testing for defects. In step 810, the program/erase count will be incremented by one and the process will continue at step 826 where the data (received in step 802) will be programmed into the appropriate memory cells in the appropriate one or more vertical columns After step 826, the process loops back to step 802 when more data is received.

FIG. 9 also shows step 828 for reading data. There is a dotted line between step 826 and step 828 to indicate that it is not an automatic sequence and the timing is unknown. That is, the systems does not necessarily automatically read the data after programming. The system will perform a reading of the data in step 828 in response to a user request to read data which can happen at any time, randomly, if at all. After programming and/or reading, the process loops back to step 802 when data and a requested program is received. If in step 806, it is determined that the cycle count is equal to X, then it is time to perform the stressing and testing of FIG. 8. Therefore, in step 822, the system will perform an erase process, including or in conjunction with the stressing and testing for defects (e.g., of FIG. 8). Thus, biasing of the vertical columns with the pattern(s) of stress voltages to stress the device and the testing for a short are performed in response to and after the multiple program and erase cycles.

In step 824, the program/erase cycle count will be reset to zero and the process will continue at step 826 to program data into the appropriate memory cells of the appropriate vertical columns, but no data will be programmed into vertical columns marked as bad (see steps 714 and 728 of FIG. 8).

Figure 10:
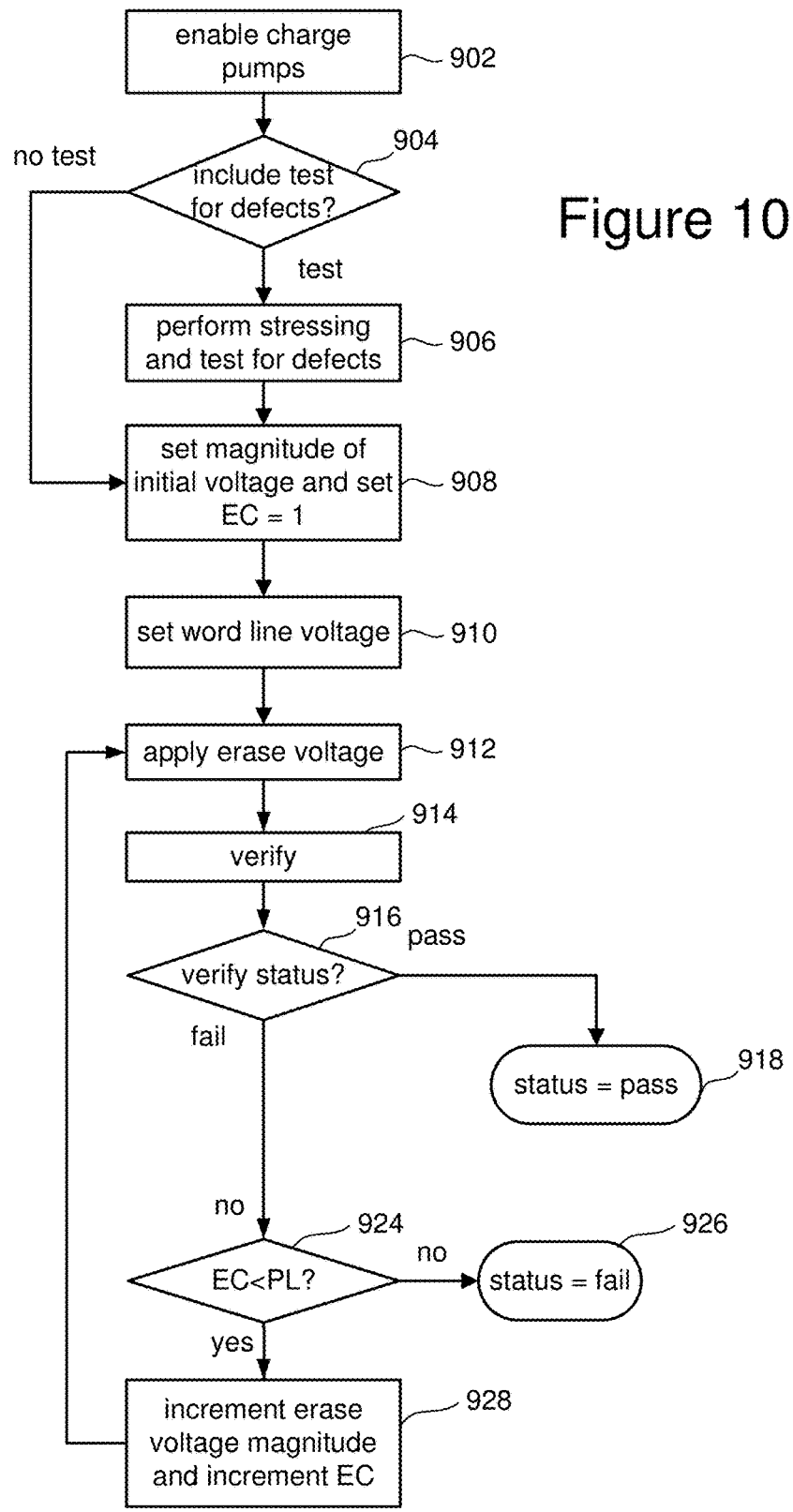
FIG. 10 is a flow chart describing one embodiment of a process for erasing.

FIG. 10 is a flowchart describing one embodiment of a process for erasing. The process of FIG. 10 can be used to implement step 808 of FIG. 9 as well step 822 of FIG. 9. In one embodiment, the process of FIG. 10 is performed by the state machine. However, in other embodiments, other components (including the controller or other circuits can perform the process of FIG. 10. Generally, an erase operation can include multiple erase-verify iterations which are performed until a verify condition is met, at which point the erase operation ends. In one example approach, the memory device includes NAND strings which have one or more drain side select gate (SGD) transistors on one end and one or more source side select gate (SGS) transistors on the other end. When an erase voltage is applied to the bit line in a one sided erase, or to the bit line and source line in a two sided erase, the select gate transistors generate a sufficient amount of gate-induced drain leakage (GIDL) current to charge up the floating body (channel) of the NAND string. GIDL increases in proportion to the drain-to-gate voltage (Vdg) of the select gate transistors. The charge in the channel is used to erase the memory cells.

Looking back at FIG. 2, memory die 108 includes power control circuitry 116, which in one embodiment includes charge pumps for providing high voltages. In step 902 of FIG. 10, the charge pumps are enabled to provide the high voltages required for the erase process. In step 904, the system checks whether the erase process is to be performed with the process for stressing and testing for defects (see step 810 of FIG. 9) or without the process for stressing and testing for defects (see step 808 of FIG. 9). If the erase process is to be performed with the process for stressing and testing for defects, then the erase process continues at step 906 and the system provides the stressing and tests for one or more defects. One embodiment tests for shorts, as described above; however, other embodiments can test for other defects. The process of FIG. 8 is one example implementation of step 906.

If the erase process is to be performed without the process for testing for defects, or after step 906, the erase process continues at step 908. In one embodiment, step 908 initializes an erase voltage (Verase) to a starting value, e.g., 20 volts and initializes a counter EC at 1. In step 910, word lines for blocks being erased are set at 0 v or slightly above 0 volts. For blocks that are not to be erased, the word lines can be floated or set to ~20 v. Step 912 includes charging the channel of NAND string by applying the erase voltage (Verase) to the NAND string via the bit line and setting control gate voltages at or slightly above 0 V. The large potential difference across the tunneling layer, between the channel and the control gate, encourages tunneling.

Step 914 includes performing an erase-verify test for all memory cells in the NAND string. For example, this can involve applying a common erase-verify control gate voltage to each control gate of the NAND string while detecting the current through the NAND string. If the current is above a reference current, indicating the string is conductive, the erase-verify test is passed.

Decision step 916 determines if the erase-verify test has passed for each NAND string of the block. If the answer is "yes," the erase operation ends successfully at step 918. If the answer is "no," then a decision step 924 determines if the number of erase cycles (indicated by counter EC) is less than a predetermined limit. If the answer is "no," then the erase operation ends unsuccessfully at step 926. If the answer is "yes," then the erase voltage (Verase) is increased by a predetermined step size and the counter EC incremented at step 928, and another iteration is performed starting again at step 912.

One embodiment includes a plurality of non-volatile memory cells arranged in a three dimensional structure comprising a plurality of vertical columns with each vertical column of the plurality including multiple memory cells and a managing circuit in communication with the vertical columns. The managing circuit is configured to apply one or more patterns of stress voltages to the plurality of vertical columns of non-volatile memory cells with different voltages applied to each vertical column of pairs of adjacent vertical columns being tested for shorts. The managing circuit is configured to test for a defect (e.g., a short) in the pairs of adjacent vertical columns after applying the one or more patterns of stress voltages.

In one example implementation, the managing circuit is configured to apply the one or more patterns of stress voltages by applying different patterns of stress voltages. Each pattern of stress voltages is configured to test for different sets of shorts between pairs of adjacent vertical columns. In this example implementation, the managing circuit is configured to test for a short by performing a separate test for each pattern of stress voltages. Each separate test includes programming data to memory cells and reading back the data from the memory cells.

One embodiment includes a method that comprises biasing a plurality of vertical columns of non-volatile memory cells with a first pattern of stress voltages such that neighboring vertical columns being tested for shorts are biased at different levels, each of the plurality of vertical columns includes multiple memory cells; and testing neighboring vertical columns for a short after the applying of the first pattern of stress voltages. One example implementation further comprises biasing the vertical columns of non-volatile memory cells with a second pattern of stress voltages such that neighboring vertical columns being tested for shorts are biased at different levels, the first pattern of stress voltages is different than the second pattern of stress voltages, the first pattern of stress voltages tests for different shorts than the second pattern of stress voltages, the testing is performed after the applying of the second pattern of stress voltages.

One embodiment includes a plurality of non-volatile memory cells arranged in vertical columns that form a three dimensional memory structure; and a managing circuit in communication with the vertical columns to perform program and erase processes on the memory cells, the managing circuit configured to perform a test for a defect in the three dimensional structure when performing a subset of the erase processes during user operation.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication: if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a plurality of non-volatile memory cells arranged in a three dimensional structure comprising a plurality of vertical columns with each vertical column of the plurality of vertical columns including multiple memory cells; and
   a managing circuit in communication with the vertical columns, the managing circuit is configured to apply multiple different patterns of stress voltages to the plurality of vertical columns of non-volatile memory cells during a stress operation with different voltages applied to each vertical column of pairs of adjacent vertical columns, each pattern of stress voltages is configured to evoke different sets of defects between pairs of adjacent vertical columns, the memory cells are not programmed during the stress operation, the managing circuit is configured to test for defects in the pairs of adjacent vertical columns after applying the patterns of stress voltages by programming test data and sensing the test data the managing circuit is configured to test for defects by performing a separate test for each pattern of stress voltages, each separate test includes programming data to memory cells and reading back the data from the memory cells.

2. The apparatus of claim 1, wherein:
   the multiple different patterns of stress voltages include patterns of high and low stress voltages; and
   for pairs of adjacent vertical columns, a pattern of stress voltages provides one vertical column with a high voltage and another vertical column with a low voltage.

3. The apparatus of claim 1, wherein:
   the managing circuit is configured to apply the multiple different patterns of stress voltages by applying a first pattern of stress voltages; and
   the managing circuit is configured to test for defects by programming a memory cell in each of the plurality of vertical columns with data that matches the first pattern of stress voltages, reading from the memory cell in each of the set of vertical columns and determining whether data read matches data programmed.

4. The apparatus of claim 1, wherein:
the plurality of non-volatile memory cells and the managing circuit are on a memory die;
the multiple different patterns of stress voltages are determined by the memory die; and
the applying multiple different patterns of stress voltages to the plurality of vertical columns and the test for defects are performed entirely on the memory die.

5. The apparatus of claim 4, wherein:
the managing circuit includes a state machine; and
the state machine is configured to apply the multiple different patterns of stress voltages to the plurality of vertical columns and to test for defects.

6. The apparatus of claim 1, wherein:
the managing circuit is configured to perform multiple program and erase cycles for the vertical columns of non-volatile memory cells; and
the managing circuit is configured to apply the multiple different patterns of stress voltages to the plurality of vertical columns and to test for defects in response to and after the multiple program and erase cycles.

7. The apparatus of claim 1, wherein:
the managing circuit is configured to apply the multiple different patterns of stress voltages to the plurality of vertical columns and to test for defects as part of an erase process for the vertical columns of non-volatile memory cells.

8. The apparatus of claim 1, wherein:
the managing circuit is configured to perform a plurality of erase processes during user operation; and
the managing circuit is configured to apply the multiple different patterns of stress voltages to the plurality of vertical columns and to test for defects in conjunction with a subset of the erase processes during user operation.

9. The apparatus of claim 1, wherein:
the vertical columns of non-volatile memory cells are on a memory die;
the memory die includes a set of N I/O pins; and
the multiple different patterns of stress voltages include an arrangement of N signals that is repeated across the plurality of vertical columns.

10. The apparatus of claim 1, wherein:
the managing circuit is configured to apply the multiple different patterns of stress voltages to the plurality of vertical columns of non-volatile memory cells and test for defects in the pairs of adjacent vertical columns during user operation.

11. The apparatus of claim 1, wherein:
the managing circuit is configured to apply the multiple different patterns of stress voltages to the plurality of vertical columns of non-volatile memory cells and test for defects in the pairs of adjacent vertical columns after receiving a request to program data.

12. The apparatus of claim 1, wherein:
the managing circuit is configured to apply the multiple different patterns of stress voltages to the plurality of vertical columns of non-volatile memory cells and test for defects in the pairs of adjacent vertical columns after every X program-erase cycles.

13. The apparatus of claim 1, wherein:
the managing circuit is configured to apply the multiple different patterns of stress voltages to the plurality of vertical columns for longer in time than the managing circuit is configured to apply program pulses to the plurality of vertical columns.

\* \* \* \* \*

UNITED STATES PATENT AND TRADEMARK OFFICE
CERTIFICATE OF CORRECTION

PATENT NO. : 9,830,998 B2  
APPLICATION NO. : 14/716794  
DATED : November 28, 2017  
INVENTOR(S) : Pachamuthu et al.

Page 1 of 1

It is certified that error appears in the above-identified patent and that said Letters Patent is hereby corrected as shown below:

Column 16, Line 47 (Claim 1, Line 20), please change "data the" to -- data, the --.

Signed and Sealed this  
Eighteenth Day of September, 2018

Andrei Iancu  
*Director of the United States Patent and Trademark Office*